United States Patent
Hioka et al.

(10) Patent No.: US 9,523,745 B2
(45) Date of Patent: Dec. 20, 2016

(54) MAGNETIC SENSOR AND METHOD OF MANUFACTURING THE SAME

(71) Applicant: SII Semiconductor Corporation, Chiba-shi, Chiba (JP)

(72) Inventors: Takaaki Hioka, Chiba (JP); Mika Ebihara, Chiba (JP)

(73) Assignee: SII Semiconductor Corporation (JP)

(*) Notice: Subject to any disclaimer, the term of this patent is extended or adjusted under 35 U.S.C. 154(b) by 0 days.

(21) Appl. No.: 15/040,767

(22) Filed: Feb. 10, 2016

(65) Prior Publication Data
US 2016/0245881 A1    Aug. 25, 2016

(30) Foreign Application Priority Data

Feb. 19, 2015  (JP) .................. 2015-030878
Dec. 22, 2015  (JP) .................. 2015-250319

(51) Int. Cl.
*H01L 43/14*  (2006.01)
*G01R 33/07*  (2006.01)
*G01R 33/00*  (2006.01)
*H01L 43/04*  (2006.01)
*H01L 43/06*  (2006.01)

(52) U.S. Cl.
CPC ......... *G01R 33/077* (2013.01); *G01R 33/0052* (2013.01); *H01L 43/04* (2013.01); *H01L 43/065* (2013.01); *H01L 43/14* (2013.01)

(58) Field of Classification Search
CPC ... G01R 33/077; G01R 33/0052; G01R 33/06; H01L 43/04; H01L 43/14; H01L 43/065; G01D 5/145
See application file for complete search history.

(56) References Cited

U.S. PATENT DOCUMENTS

2010/0117638 A1* 5/2010 Yamashita ............. G01R 33/07
                                                            324/233

OTHER PUBLICATIONS

Abstract, Publication No. JP 2003-130936, Publication Date May 8, 2003.
Abstract, Publication No. JP 2012-047708, Publication Date Mar. 8, 2012.
Abstract, Publication No. JP 2012-151285, Publication Date Aug. 9, 2012.

* cited by examiner

*Primary Examiner* — Roy Potter
*Assistant Examiner* — Paul Patton
(74) *Attorney, Agent, or Firm* — Adams & Wilks

(57) ABSTRACT

Provided are a magnetic sensor and a method of manufacturing the same capable of arranging a magnetic converging plate on a substrate on which Hall elements and a circuit are formed, with a small variation in position while suppressing an increase in number of work processes, the magnetic converging plate having high magnetic permeability and low coercive force. In the magnetic sensor and the method of manufacturing the same, in forming Hall elements and a circuit on a silicon substrate, a magnetic converging plate holder having a pattern recessed to have the same shape and size as those of a magnetic converging plate is formed, and, into the magnetic converging plate holder, the magnetic converging plate manufactured through processes different from those of the silicon substrate on which the Hall elements and the circuit are formed is inserted.

8 Claims, 3 Drawing Sheets

Formation of Hall element

Formation of base conductive layer

Formation of resist pattern for converging plate

Formation of converging plate by plating

Removal of resist

MAGNETIC SENSOR AND METHOD OF MANUFACTURING THE SAME

BACKGROUND OF THE INVENTION

1. Field of the Invention

The present invention relates to a magnetic sensor that includes a magnetic converging plate and is configured to detect magnetic fields in a vertical direction and a horizontal direction, and to a method of manufacturing the magnetic sensor.

2. Description of the Related Art

Hall elements allow non-contact position detection and non-contact angle detection as magnetic sensors, and are thus often used in various applications.

First, the principle of magnetic detection with the Hall elements is described. When a magnetic field is applied vertically to a current flowing through a substance, an electric field (Hall voltage) is generated in a direction vertical to both the current and the magnetic field. Thus, the typical Hall elements are configured to detect a vertical magnetic field component with a current caused to flow on a surface of a substrate (wafer).

In addition, it is known that the Hall elements can detect not only a vertical magnetic field but also a horizontal magnetic field in combination with a magnetic thin film formed of a material having high magnetic permeability, with the use of the magnetic thin film as a magnetic converging plate configured to change a direction of a magnetic flux to guide the magnetic flux to the Hall elements.

In order to realize a magnetic sensor that has a balanced ratio between vertical magnetic field sensitivity and horizontal magnetic field sensitivity and thus has a small variation in magnetic property, a positional relationship between the Hall elements and the magnetic converging plate is important (for example, see Japanese Patent Application Laid-open No. 2012-47708).

In order to reduce a variation in magnetic property due to an influence of a variation in position of the magnetic converging plate, there are a method involving patterning the magnetic converging plate on a Si substrate on which the Hall elements and a circuit are formed in advance through photolithography or the like, and a method involving forming the magnetic converging plate by plating (for example, see Japanese Patent Application Laid-open No. 2012-151285). An example is briefly described with reference to FIG. 2A to FIG. 2E.

First, as illustrated in FIG. 2A, a pair of Hall elements 2 is formed on a surface of a P-type semiconductor substrate 1 with a space. A protective film 3 serving as an insulator such as a polyimide film is formed on surfaces of the Hall elements 2 and the P-type semiconductor substrate 1.

Then, as illustrated in FIG. 2B, a base conductive layer 11 of a magnetic converging plate is formed on the protective film 3 serving as an insulator.

Next, as illustrated in FIG. converging plate, a resist is applied on the base conductive layer 11, and a portion of the resist formed on a magnetic converging plate forming region is removed.

Then, as illustrated in FIG. 2D, the magnetic converging plate 10 is formed by plating in the region from which the resist is removed.

Finally, as illustrated in FIG. 2E, the remaining resist is removed, thereby being capable of forming the magnetic converging plate 10 in a desired region.

Further, there is also a method involving arranging, on a Si substrate on which the Hall elements and the circuit are formed, a structure for adjusting a position of a magnetic converging plate, to thereby improve accuracy of position adjustment and thus reduce a variation in magnetic property (for example, see Japanese Patent Application Laid-open No. 2003-130936).

When the magnetic converging plate is formed by plating and sputtering, in order to realize a reduction in coercive force and high magnetic permeability of a magnetic material, it is generally required to perform annealing at a high temperature equal to or higher than the Curie point. However, annealing at such high temperature cannot be applied to the magnetic converging plate after formation of the Hall elements and the circuit, and hence it is difficult to attain the magnetic converging plate having high magnetic permeability and low coercive force.

Further, the method involving the arrangement of the structure for adjusting the position of the magnetic converging plate has a drawback that the number of processes is increased due to additional processes such as forming the structure for position adjustment and removing the structure after the magnetic converging plate is arranged.

SUMMARY OF THE INVENTION

It is an object of the present invention to provide a method of manufacturing a magnetic sensor, including arranging a magnetic converging plate on a substrate on which Hall elements and a circuit are formed, with a small variation in position while suppressing an increase in number of work processes, the magnetic converging plate having high magnetic permeability and low coercive force.

In order to achieve the above-mentioned object, a method of manufacturing a magnetic sensor according to one embodiment of the present invention is as follows.

The method of manufacturing a magnetic sensor has a feature of including: forming, in forming a Hall element and a circuit on a silicon substrate, a pattern recessed to have the same shape and size as those of a magnetic converging plate, namely, a magnetic converging plate holder; and inserting, into the magnetic converging plate holder, the magnetic converging plate manufactured through processes different from those of the silicon substrate on which the Hall element and the circuit are formed.

With the use of the above-mentioned measure, it is possible to suppress a variation in position of the magnetic converging plate, and thus reduce a variation in magnetic property. Further, the magnetic converging plate holder for adjusting the position of the magnetic converging plate is formed simultaneously with the formation of the circuit, and hence an increase in number of processes is prevented, thereby being capable of suppressing the manufacturing cost. Further, the magnetic converging plate and the circuit are manufactured in the different processes, and hence high-temperature annealing can be performed after a magnetic film is formed. Consequently, the magnetic converging plate having high magnetic permeability and low coercive force can be manufactured, and a magnetic sensor having higher sensitivity and higher accuracy can thus be realized.

DETAILED DESCRIPTION OF THE INVENTION

A detailed description is now given of an embodiment of the present invention with reference to the drawings.

FIG. 1A to FIG. 1D are sectional views for illustrating main parts of a method of manufacturing a magnetic sensor according to the embodiment of the present invention in order of process.

Figure 1A:
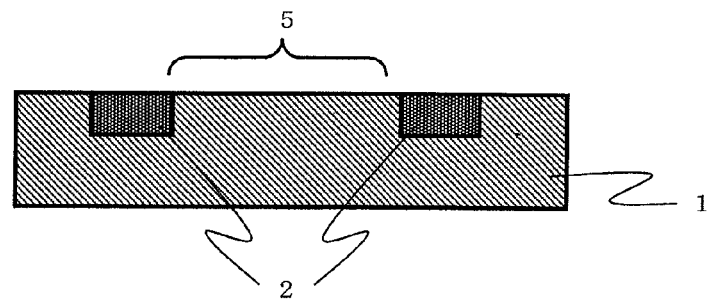
FIG. 1A to FIG. 1D are sectional views for illustrating main parts of a method of manufacturing a magnetic sensor according to the present invention in order of process.

First, as illustrated in FIG. 1A, a semiconductor circuit that forms a magnetic sensor including Hall elements 2 is formed on a surface of a P-type semiconductor substrate 1 through a normal semiconductor manufacturing process. The Hall element 2 is a horizontal Hall element including a square or cross-shaped vertical magnetic field sensing portion having a four-fold rotational axis, and, at respective vertices and end portions thereof, vertical magnetic field detection control current input terminals and vertical magnetic field Hall voltage output terminals corresponding to surface N-type highly-doped regions having the same shape. In this embodiment, a pair of the Hall elements 2 is formed so that the Hall elements 2 are separated from each other. A region by which the Hall elements 2 of the pair of Hall elements 2 are separated from each other is referred to as a separation region 5.

Figure 1B:
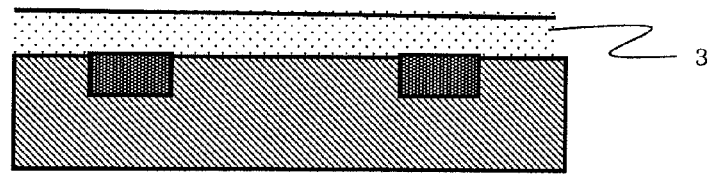

Then, as illustrated in FIG. 1B, a protective film 3 serving as an insulator such as a polyimide film is formed on the P-type semiconductor substrate 1 on which the semiconductor circuit that forms the magnetic sensor including the Hall elements 2 is formed. It is desired that the protective film 3 have a thickness of from about 10 μm to about 30 μm. The protective film 3 is formed also for the purpose of alleviating a stress of a magnetic converging plate to be formed thereon. If the thickness is too large, a distance from the Hall elements 2 is increased, resulting in a reduction in horizontal magnetic field sensitivity.

Figure 1C:
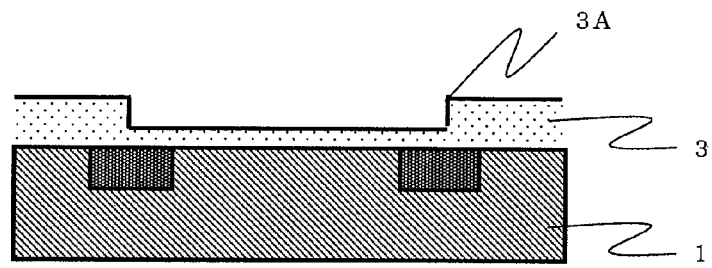

Next, as illustrated in FIG. 1C, the protective film 3 serving as an insulator is etched to form a magnetic converging plate holder 3A having a recessed shape in a region from the separation region 5 to the Hall elements 2. At this time, it is desired that the magnetic converging plate holder 3A be formed through etching of the protective film by about ½ of the thickness thereof. Further, it is desired that the magnetic converging plate holder 3A be formed so as to have the same size as that of the magnetic converging plate 10, and edges of the magnetic converging plate holder 3A overlap the Hall elements. The etching can be performed in a process similar to that in forming a Pad opening portion in the P-type semiconductor substrate 1.

The magnetic converging plate is manufactured as follows through a process different from and independent of the semiconductor manufacturing process: a thin film is formed by plating and the like, and the thin film is processed into a shape of the magnetic converging plate.

It is desired that the magnetic converging plate be formed of a soft magnetic material having low coercive force and high magnetic permeability such as permalloy or supermalloy. In this case, when a soft magnetic thin film having low coercive force and high magnetic permeability is formed by plating and the like, it is preferred to perform high-temperature annealing after the plating. However, the annealing treatment cannot be performed when the soft magnetic thin film is formed on the semiconductor substrate with plating, and hence a magnetic converging plate that has a more excellent performance and is formed of a soft magnetic material cannot be manufactured. In contrast, when the magnetic converging plate is formed independent of the semiconductor substrate as in the present invention, there is no need to consider an influence of high-temperature annealing on the semiconductor substrate. Incidentally, annealing at a high temperature of from 800° C. to 1,000° C. is performed to form the magnetic converging plate 10 according to the present invention.

Further, it is desired that the magnetic converging plate 10 be processed into the same shape as that of the magnetic converging plate holder 3A so that the magnetic converging plate 10 can be arranged with no difficulty. It is desired that the magnetic converging plate 10 be processed from a thin film, and a large number of magnetic converging plates 10 can be processed with the use of laser processing or a mold.

Further, it is desired that the magnetic converging plate 10 have a thickness of from about 30 μm to about 50 μm.

FIG. 3A to FIG. 3F are plan views relating to the magnetic converging plate and the magnetic converging plate holder according to the present invention. As illustrated in FIG. 3A to FIG. 3F, the magnetic converging plate 10 has, for example, a circular, square, or cross shape having a four-fold rotational axis in a plan view, and has, at at least one point of an outer periphery thereof, a recessed portion or a protruded portion for magnetic converging plate rotation direction position adjustment. In addition, the magnetic converging plate holder 3A is formed into the same shape as that of the magnetic converging plate having the recessed portion or the protruded portion for magnetic converging plate rotation direction position adjustment so that the magnetic converging plate can be accommodated with no difficulty. In general, thin magnetic converging plates have magnetic anisotropy. Thus, through the adjustment of the position of the magnetic converging plate in the rotation direction, crystal orientation of the magnetic converging plate is adjusted and a variation in magnetic property due to the magnetic anisotropy is suppressed, to thereby attain a magnetic sensor having a small variation in property.

Further, it is preferred that the recessed portion or the protruded portion for magnetic converging plate rotation direction position adjustment be formed to be smaller than the magnetic converging plate in size so as not to affect the magnetic property of the Hall element 2. In addition, in order that the recessed portion or the protruded portion for magnetic converging plate rotation direction position adjustment does not affect the magnetic property of the Hall element when the magnetic converging plate is mounted on a magnetic sensor chip having the magnetic converging plate holder 3A formed therein, it is desired that positions of the magnetic converging plate holder 3A and the recessed portion or the protruded portion for magnetic converging plate rotation direction position adjustment be designed so that the recessed portion or the protruded portion for magnetic converging plate rotation direction position adjustment may be formed as far from the Hall elements 2 as possible.

Figure 3A:
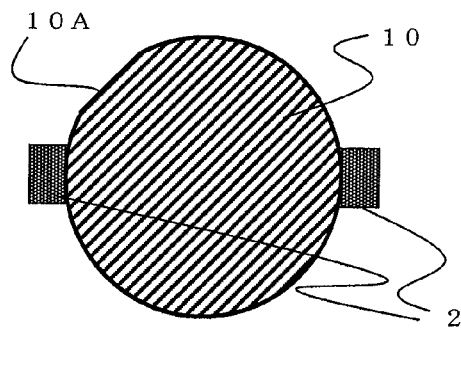
FIG. 3A to FIG. 3F are plan views relating to a magnetic converging plate and a magnetic converging plate holder according to the present invention.
Figure 3B:
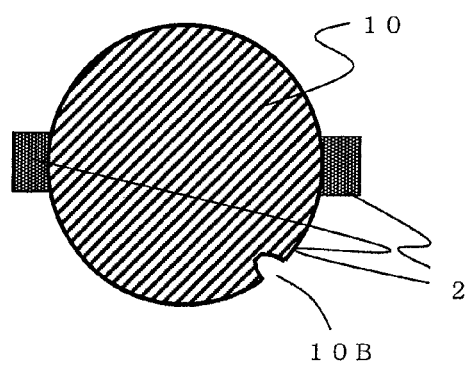
Figure 3C:
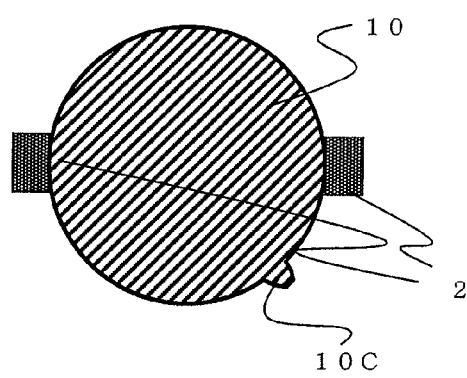
Figure 3D:
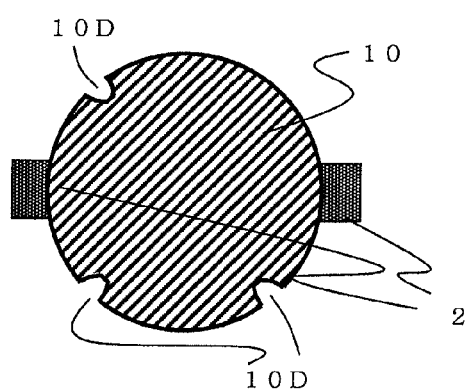
Figure 3E:
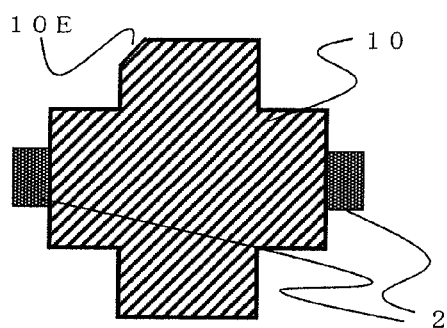
Figure 3F:
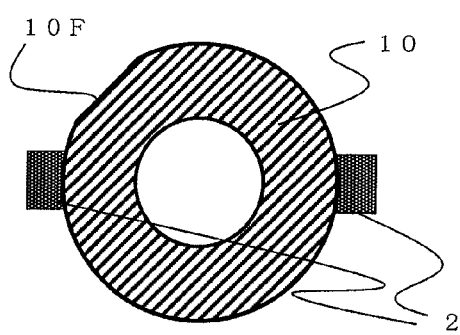

Incidentally, the magnetic converging plate 10 and the magnetic converging plate holder 3A of FIG. 3A have, a circular shape having a straight line (string) portion 10A formed by cutting out part of the circle in parallel to a tangent to the circle, the straight line portion 10A being similar to an orientation flat. The magnetic converging plate 10 and the magnetic converging plate holder 3A of FIG. 3B have a circular shape having a recessed portion (notch) 10B. The magnetic converging plate 10 and the magnetic converging plate holder 3A of FIG. 3C have a circular shape having a protruded portion 10C. The magnetic converging plate 10 and the magnetic converging plate holder 3A of FIG. 3D have a circular shape having a plurality of protruded portions 10D. The magnetic converging plate 10 and the magnetic converging plate holder 3A of FIG. 3E have a cross shape having a cut corner portion 10E. The magnetic converging plate 10 and the magnetic converging plate holder 3A of FIG. 3F have a doughnut shape having a straight line (string) portion 10F formed by cutting out part of the circle in parallel to a tangent to the circle, the straight line portion 10F being similar to an orientation flat.

Figure 1D:
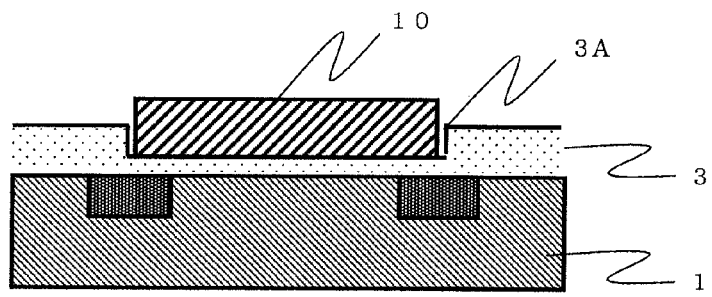
Figure 2A:
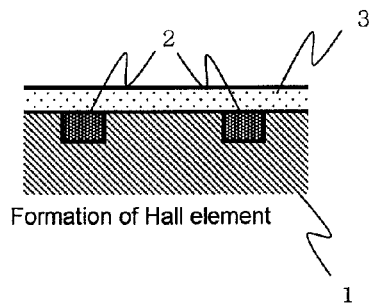
FIG. 2A to FIG. 2E are sectional views for illustrating main parts of a related-art method of forming a magnetic converging plate by plating in order of process.
Figure 2B:
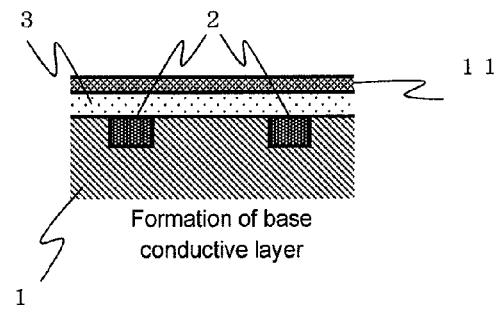
Figure 2C:
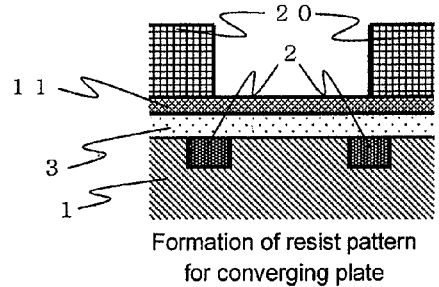
Figure 2D:
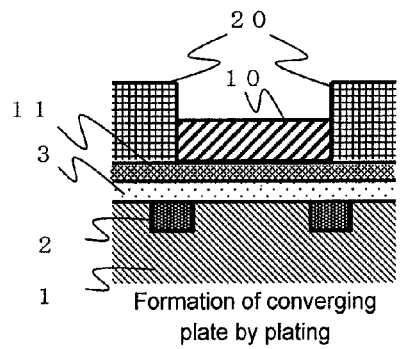
Figure 2E:
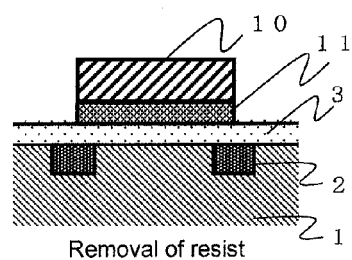

Then, as illustrated in FIG. 1D, the processed magnetic converging plate 10 is mounted on the magnetic sensor chip having the magnetic converging plate holder 3A formed therein. It is desired that the magnetic converging plate 10 be mounted with an insulating adhesive dropped in the magnetic converging plate holder 3A. With regard to the mounting, position adjustment accuracy is improved due to the formation of the magnetic converging plate holder 3A, and hence the magnetic converging plate 10 can be implemented sufficiently even when mounted with the use of a chip bonder. Depending on the thickness of the protective film 3, the magnetic converging plate 10 may be protruded from a surface of the protective film 3, or the magnetic converging plate 10 may be completely accommodated in the magnetic converging plate holder 3A.

With the use of the above-mentioned measure, the variation in position of the magnetic converging plate 10 is suppressed, thereby being capable of reducing the variation in magnetic property. Further, the magnetic converging plate holder for adjusting the position of the magnetic converging plate is formed simultaneously with the formation of the circuit, and hence an increase in number of processes is prevented, thereby being capable of suppressing the manufacturing cost. Further, the magnetic converging plate and the circuit are manufactured in the different processes, and hence high-temperature annealing can be performed after the magnetic film is formed. Consequently, the magnetic converging plate having high magnetic permeability and low coercive force can be manufactured, and the magnetic sensor having higher sensitivity and higher accuracy can thus be realized.

What is claimed is:

1. A method of manufacturing a magnetic sensor, the magnetic sensor comprising:
    Hall elements formed on a surface of a semiconductor substrate; and
    a magnetic converging plate formed above the Hall elements through an intermediation of a protective film,
    the method comprising:
    forming the protective film on the Hall elements;
    partially removing the protective film, to thereby form a magnetic converging plate holder having a recessed shape;
    forming the magnetic converging plate separately from and independent of the semiconductor substrate in which the magnetic converging plate holder is formed, and then performing high-temperature annealing to the magnetic converging plate; and
    inserting and fixing the magnetic converging plate subjected to the high-temperature annealing to the magnetic converging plate holder.

2. A method of manufacturing a magnetic sensor according to claim 1, wherein the high-temperature annealing is performed at a process temperature of from 800° C. to 1,000° C.

3. A method of manufacturing a magnetic sensor according to claim 1, wherein the magnetic converging plate subjected to the high-temperature annealing is processed into one of a circle, square, and cross shape having a four-fold rotational axis in a plan view, and has, at at least one point of an outer periphery of the magnetic converging plate, one of a recessed portion and a protruded portion for magnetic converging plate rotation direction position adjustment.

4. A method of manufacturing a magnetic sensor according to claim 1, wherein the magnetic converging plate subjected to the high-temperature annealing is formed into the same planar shape as a planar Shape of the magnetic converging plate holder.

5. A magnetic sensor, comprising:
    a semiconductor substrate;
    a pair of Hall elements formed on a surface of the semiconductor substrate so as to be separated from each other by a separation region;
    a protective film formed on the semiconductor substrate so as to cover the pair of Hall elements;
    a magnetic converging plate holder that has a recessed shape and is formed in the protective film in a region from the separation region to each of the pair of Hall elements; and
    a magnetic converging plate arranged so as to fit the recessed shape of the magnetic converging plate holder.

6. A magnetic sensor according to claim 5, wherein the magnetic converging plate has, at at least one point of an outer periphery of the magnetic converging plate, one of a recessed portion and a protruded portion for magnetic converging plate rotation direction position adjustment.

7. A magnetic sensor according to claim 6, wherein the magnetic converging plate holder has one of a protruded portion and a recessed portion formed into the same shape as a shape of the one of the recessed portion and the protruded portion for magnetic converging plate rotation direction position adjustment formed in the magnetic converging plate.

8. A magnetic sensor according to claim 6, wherein the one of the recessed portion and the protruded portion for magnetic converging plate rotation direction position adjustment represents a direction of magnetic anisotropy of the magnetic converging plate.

* * * * *